United States Patent [19]

Chang et al.

[11] Patent Number: 4,996,165

[45] Date of Patent: Feb. 26, 1991

[54] SELF-ALIGNED DIELECTRIC ASSISTED PLANARIZATION PROCESS

[75] Inventors: Mau-Chung F. Chang; Peter M. Asbeck, both of Thousand Oaks, Calif.

[73] Assignee: Rockwell International Corporation, El Segundo, Calif.

[21] Appl. No.: 341,464

[22] Filed: Apr. 21, 1989

[51] Int. Cl.[5] .................... H01L 21/331; H01L 21/31
[52] U.S. Cl. ........................................ 437/31; 437/33; 437/17; 437/203; 437/944; 437/978; 437/228; 148/DIG. 72; 148/DIG. 43; 148/DIG. 75
[58] Field of Search ................. 437/944, 228, 231, 31, 437/32, 33, 978, 203; 148/DIG. 72, DIG. 43, DIG. 75; 357/34, 43; 156/643, 649

[56] References Cited

U.S. PATENT DOCUMENTS

| | | | |
|---|---|---|---|
| 4,222,792 | 9/1980 | Lever et al. | 437/231 |
| 4,326,330 | 4/1982 | LePage et al. | 437/944 |
| 4,448,800 | 5/1984 | Ehara et al. | 437/944 |
| 4,504,333 | 3/1985 | Kurosawa | 437/944 |
| 4,515,828 | 5/1985 | Economy et al. | 437/231 |
| 4,545,852 | 10/1985 | Barton | 156/643 |
| 4,676,867 | 6/1987 | Elkins et al. | 156/643 |
| 4,689,113 | 8/1987 | Balasubramanyam et al. | 156/643 |
| 4,731,340 | 3/1988 | Chang et al. | 437/31 |
| 4,783,238 | 11/1988 | Roosner | 156/649 |
| 4,806,504 | 2/1989 | Cleeves | 437/228 |
| 4,839,303 | 6/1989 | Tully et al. | 437/31 |
| 4,889,824 | 12/1989 | Selle et al. | 437/31 |
| 4,914,049 | 4/1990 | Huang et al. | 437/31 |

FOREIGN PATENT DOCUMENTS 0287146  12/1986  Japan .................................. 437/944

OTHER PUBLICATIONS

"Planarization Technology for Josephson Integrated Circuits" by Nagasawa et al., from IEEE Electron Device Letters, vol. 9, No. 8, Aug. 1988, pp. 414–416.
"AlGaAs/GaAs Heterojunction Bipolar Transistors Fabricated Using a Self-Aligned Dual-Lift-Off Process" by Chang et al., from IEEE Electron Device Letters, vol. EDL-8, No. 7, Jul. 1987, pp. 303–305.
"Planar Interconnection Technology for LSI Fabrication Utilizing Lift-Off Process" by Ehara et al., from Journal of Electrochemical Society: Solid-State Science and Technology, vol. 133, No. 2, Feb. 1984, pp. 419–424.
Furuya, K., et al., *Electronics Letters*, Mar. 4. 1982, vol. 18, No. 5, pp. 204–205.

*Primary Examiner*—Brian E. Hearn
*Assistant Examiner*—T. N. Quach
*Attorney, Agent, or Firm*—Gregory D. Ogrod; John C. McFarren

[57] ABSTRACT

A method for planarizing surfaces in multi-layered semiconductor structures using elevated features in the form of semiconductor materials, such as for forming heterojunctions, or interconnection metal. A process of forming the features includes leaving residual photoresist on the features. After feature formation and definition of transistor or other structure locations, dielectric material is deposited across the structure. Remaining photoresist is subsequently removed along with dielectric deposited thereon leaving dielectric between the features. A layer of polyimide is spun on the structure and into depressions between the dielectric and features. Typically material deposition, etching, dielectric backfilling and spin-coating steps are repeated until a predetermined number of contact or conductivity regions or interconnection metal layers are formed in the desired multi-layered structure. In addition, intermediate etching steps may be employed for defining one or more transistor base or collector locations and metal or alloys deposited therein. Height variations in the resulting planar surface are controllable to within a fraction of a micron or less.

11 Claims, 9 Drawing Sheets

SELF-ALIGNED DIELECTRIC ASSISTED PLANARIZATION PROCESS

BACKGROUND OF THE INVENTION

1. Field of the Invention

The present invention relates to methods of manufacturing semiconductor devices and more particularly to a method of planarizing a semiconductor structure during manufacture by backfilling etched depressions between raised features with a self-aligning, lift-off layer of dielectric material which is then selectively removed from the features and covered with a self-aligning polymer material. The invention further relates to a method of improving the isoplanar characteristics of metallic interconnection layers in multi-layered semiconductor structures through polyimide deposition on a self-aligned backfilled dielectric layer.

2. Background of Related Art

There is a continuing need to develop integrated circuits and components that operate at higher frequencies or speeds, with reduced power and within smaller volumes. These requirements or design goals place a greater emphasis on development of increased component integration and packing density, which results in decreased feature sizes, increased interconnection complexity, and use of new or specialized materials.

However, increased packing densities and decreased feature sizes, especially for small aspect ratios, width to height, lead to surface topologies that create problems for device performance and survivability. Substantial variations in feature height, topography or morphology leads to stress in subsequently deposited layers or materials at corners or height transitions. This stress results in microcracking and other material failures. At the same time, significant height variations in one layer makes precise control of the dimensions of subsequent material layers difficult. Imprecise material deposition increases problems with breakdown and parasitics between layers or features which must be minimized while maintaining operational integrity.

Therefore, planarization techniques are generally employed to increase yield and decrease failure rates in newer circuits and to obtain desired operating characteristics. Planarization is very important for controlling variations in device performance and yield and more advanced circuit requirements place further demands on planarization techniques.

A variety of techniques have been employed in an attempt to ameliorate surface morphology problems. One technique is the application or deposition of a finishing layer across the top of various spaced-apart features comprising a photoresist or polymer material. A re-flow process is then used to spread the material to create a more uniform surface. Unfortunately, while such finishing layer material fills narrow trenches and shallow depressions, wider (and deeper) expanses, such as typically found on a mesa populated layer, tend to result in corresponding valleys and depressions in the polymer layer. Excessively large amounts of polymer are required to compensate for the effect of larger feature variations. Since very thin intermediate material layers are desired for proper via formation, this technique has proven unacceptable.

Another technique is to apply a layer of dielectric material over selected features and heat it to cause it to re-flow over uppermost surfaces and form a planar upper surface. Unfortunately, this re-flow technique requires higher temperatures than are generally compatible or acceptable with many underlying processes or devices. This technique also requires more material and greater thickness for large depressions than desired.

What is needed is a method of planarizing selected layers of a semiconductor structure with a very thin layer of material which is highly compatible with many lower temperature processes and is preferably useful with multi-layered structures.

SUMMARY OF THE INVENTION

In view of the problems and limitations encountered in the art, one purpose of the present invention is to provide a method for planarization of one or more layers in a multi-layered semiconductor structure having improved surface characteristics.

One advantage of the present invention is that the method of planarization provides a substantially isoplanar surface generally having topographical variations on the order of less than a few microns.

Another purpose of the present invention is to provide a method of planarizing surfaces during the manufacture of semiconductor structures with low complexity and easily controlled processes.

Another advantage of the present invention is that it provides a method of planarization that is highly compatible with a variety of manufacturing processes while greatly improving the yield and planar properties of resulting material structures.

The present invention provides excellent planarity with no dependence on feature sizes and spacing.

These and other purposes, objects, and advantages are obtained in a method for planarizing surfaces in a semiconductor structure wherein a series of one or more elevated features are positioned across a surface of the semiconductor structure. The features are formed by depositing a layer of photoresist on an upper surface of the structure and developing it in a desired pattern. After development and etching some photoresist remains on the upper surfaces of the features. A layer of dielectric material such as SiO is deposited across the semiconductor structure to a depth substantially the same as the height of the tallest of the features. The remaining photoresist is then removed along with any dielectric, SiO, deposited thereon. A layer of polyimide is deposited on the upper surface of the SiO and features, and extends into depressions therebetween. A preferred method of deposition for the polyimide is a spin-on process. Height variations in the resulting planar surface are controllable to within a fraction of a micron or less.

The method of the present invention is also employed with structures using multiple layers of interconnection metal. In this embodiment, a layer of interconnection material or metal is deposited on a substrate or other circuit structure and etched to form raised features or "wires". A layer of dielectric material such as SiO is then backfilled between the raised features to a height of the features. A layer of polyimide is then deposited, generally by spin coating, in spaces or depressions existing between the dielectric and metallic interconnection materials. This application typically involves repeating the depositing and etching of metallic material and subsequent backfilling and polyimide spin coating steps until a predetermined number of interconnection metal layers are formed in a multi-layered structure.

In another embodiment, the method of the invention is employed to manufacture heterojunction bipolar transistors or other multi-junction structures. Here, a heterojunction bipolar semiconductor wafer is provided having a first layer of a first conductivity type, a second layer of a semiconductor of second conductivity type on the first layer, a third layer of a semiconductor of an opposite conductivity type to the second layer being positioned on the second layer forming a p-n junction, and a fourth layer of a semiconductor of the second conductivity type on the third layer forming a second p-n junction, with at least one of the p-n junctions being a heterojunction. A photoresist pattern is formed on the wafer with an opening for defining a transistor location. The third and fourth layers are etched through an opening in the photoresist pattern down to the second layer and a portion of the second layer down toward the first layer. A dielectric material is then deposited on the second layer through the opening and the remaining photoresist material is removed along with dielectric material deposited thereon. A layer of polymer such as polyimide is subsequently deposited on the wafer and into gaps formed between the dielectric and second, third, and fourth layers. A photoresist pattern is then formed on the wafer with a second opening which defines one or more base locations for heterojunction bipolar transistors. The fourth layer of material is etched through the second opening down to the third layer and base contact metal is deposited on the third layer through the opening. A second dielectric layer is deposited on the base contact metal and on the sidewalls of the second opening. The photoresist is then lifted off with overlying second dielectric and metal materials while maintaining dielectric on the sidewalls. A location for emitter contact metal is defined on the fourth layer and emitter contact metal is deposited in that contact location. A passage through the fourth, third and second layers is provided to the first layer and collector contact metal is deposited on the first layer through the passage.

In further aspects of this embodiment, a layer of polyimide is deposited through the passage between the contact metal and surrounding layers of material.

Alternatively, additional material layers can be formed on top of the first four layers so that multiple p-n junctions are created. At the same time, the junction structure can be configured as homojunction instead of heterojunction.

BRIEF DESCRIPTION OF DRAWINGS

The novel features of the present invention may be better understood from the following description when taken in conjunction with the accompanying drawings in which like characters refer to like parts and in which:

FIG. 1 illustrates steps for manufacturing a semiconductor structure according to the method of the present invention where:

FIG. 2 illustrates the application of the method of the present invention to multi-layered interconnections where:

FIG. 3 illustrates the manufacture of HBT semiconductor devices according to the method of the present invention where:

DETAILED DESCRIPTION OF PREFERRED EMBODIMENTS

The present invention comprises a method for planarizing a surface or providing substantially isoplanar characteristics to a layer of material in a multi-layered semiconductor structure. The method of the present invention provides a planar surface on which metallic conductive layers or other features are deposited with improved yield, density, and operational integrity.

As shown in FIG. 1, a typical semiconductor structure uses a base substrate or wafer 10 which represents one of a variety of materials such as silicon, sapphire, or other semiconductor wafer materials which are known in the art and generally commercially available. One or more layers of material comprising semiconductors, metals, or dielectrics are deposited on the substrate 10 and etched and interconnected to form desired circuit elements or features. A variety of features and structures are known to those skilled in the art and it will be apparent that the present method will advance the manufacture of many alternate structures or semiconductor features. However, for purposes of illustration, and as a preferred embodiment, the invention is described below for use in the manufacture of Heterojunction Bipolar Transistor (HBT) type devices. The present invention has proven especially useful in the manufacture of such devices.

As shown in FIG. 1, the method of the invention is employed after one or more layers of interconnect or semiconductor material 12, doped or undoped, are deposited on the substrate 10. As part of manufacturing a particular semiconductor structure, features such as contact points or raised mesas, in which localized features will be formed, are manufactured in subsequent steps. These mesas are typically formed in the manufacturing process for HBT and other transistor type devices.

HBT devices or semiconductor structures use raised mesa-type features that are generally distributed across a surface with a substantially wide spacing or separation which gives rise to the problems with planarization as discussed above. At the same time, the mesas are generally manufactured to a nearly identical height which provides efficient application of the method of the present invention.

Figure 1A:
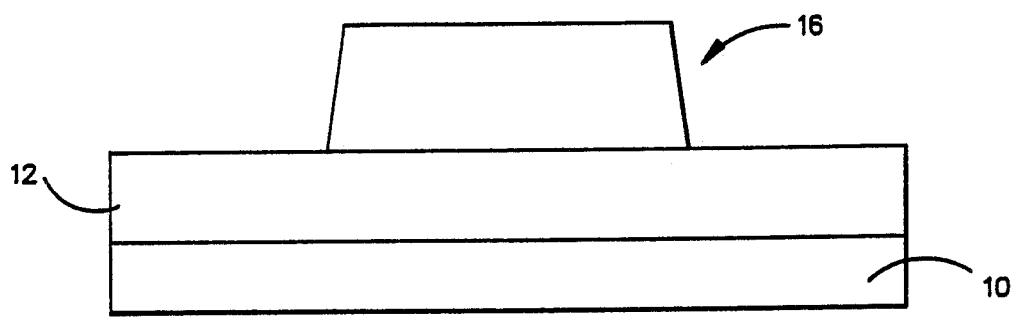
FIGS. 1a and 1b illustrate deposition of material layers and etching of mesa-type features on a substrate.
Figure 1B:
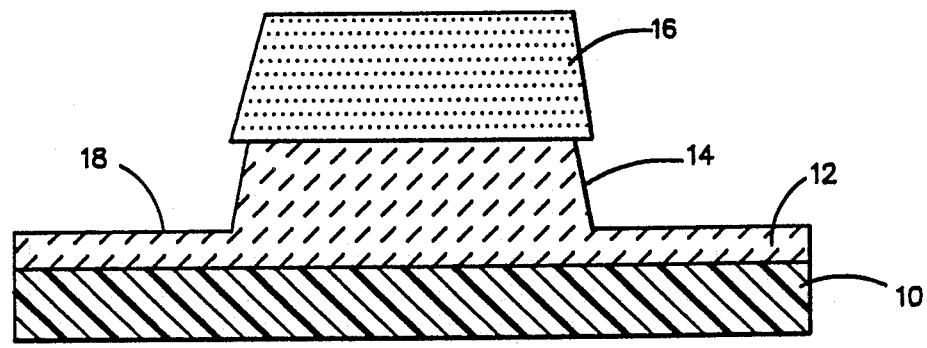
Figure 1C:
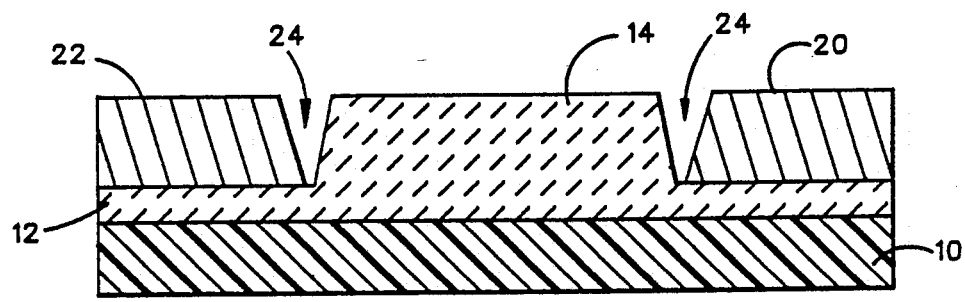
FIG. 1c illustrates backfilling between features using dielectric material.

As shown in the steps of FIGS. 1b and 1c, one or more mesas 14 are formed on the substrate 10 by first depositing a layer of photoresist 16 on the layer 12 and developing and etching a pattern therein. The photoresist 16 comprises one of several such compounds known in the art and is preferably etched using techniques such as reactive ion etching. Reactive ion etching is a preferred technique for many applications because of the substantially vertical sidewalls it provides for the mesas 14 during etching.

Once a mesa 14 is formed in current manufacturing processes, the remaining photoresist is removed and subsequent layers of material are deposited. Unfortunately, as stated above, variations in the height of the mesas 14, especially for significantly high features or low aspect ratios, produces fractures and other damage which reduces the quality and yields achievable.

New or advanced semiconductors such as HBTs operating in higher frequency realms, and at higher power levels, require nearly perfect planar surfaces to prevent breakdown, minimize parasitics, and maintain operational integrity. Attempts to planarize mesa-populated layers using existing photoresist or polymer re-flow techniques produce unacceptably large surface variations. At the same time, low complexity processing controls for material deposition or planarization steps are desired to increase device throughput during manufacture while minimizing cost impact.

Therefore, as shown in FIG. 1b, the photoresist 16 remaining on upper surfaces of the mesas 14 after initial etching is left in place to cover the upper portions or top of the features being formed. As shown in FIG. 1c, a layer of dielectric material 20 is then deposited on the etched surface 18 between the newly formed mesas 14.

The trenches or the depressions extending between the features (mesas 14) are backfilled with a dielectric material such as, but not limited to, SiO. SiO is a preferred material due to its well understood etching rate and preferred material characteristics which are used in conjunction with the polymer processing described below. The dielectric 20 is deposited to a depth which is substantially identical to the height of the mesas 14 which in preferred applications are all the same height. Since the process used to etch the substantially uniform height mesas 14 is well known and is controllable with high precision, the height of the mesas produced is easily known. Those skilled in the art of semiconductor manufacture will readily understand the parameters and process controls required to implement the deposition of SiO to the required depth (or height) and this deposition is also generally controllable with high precision.

In the preferred embodiment, the SiO is deposited by evaporation which is highly compatible with desired applications for HBT transistors. This technique is understood by those skilled in the art and does not require specialized doping, gases, or annealing which would increase the complexity and costs associated with device or structure manufacture. However, other methods of deposition could be employed, with the requisite processing controls, where desired as part of other semiconductor manufacturing steps.

Once the SiO dielectric layer 20 has been deposited to a desired depth, the remaining photoresist 16 is removed using known techniques. The removal of the photoresist 16 from the top of the mesas 14 also removes any SiO deposited thereon. This provides a reasonably planar surface 22 except for narrow "gaps" or "trenches" 24 between the SiO 20 and the vertical sidewalls of the mesas 14. Due to masking and shadow effects normally encountered in photoresist etching, as well as in depositing material into finite depressions close to features covered by a layer of photoresist material, the SiO does not interface directly nor completely with the sides of the mesas 14 or similar features. This creates a series of small gaps 24 which must be corrected.

Figure 1D:
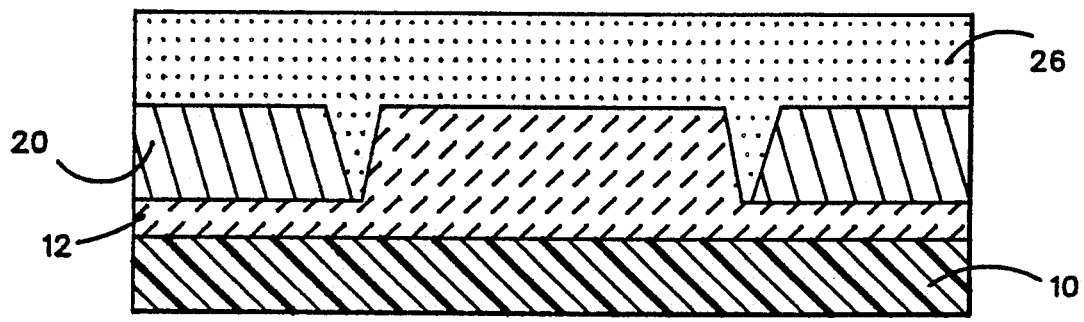
FIG. 1d illustrates deposition of a self-aligning polymer.

As shown in FIG. 1d, a layer of a polymer 26 such as polyimide is deposited on the upper surface of the dielectric 20 to provide a planar surface. Since the gaps 24 are very small or have a low aspect ratio, that is width to height, only a small amount of polyimide is required to fill them. The polyimide 26 is preferably deposited as a liquid which is spin coated on the surface 22 and flows very uniformly over that surface and into the gaps 24.

Figure 1E:
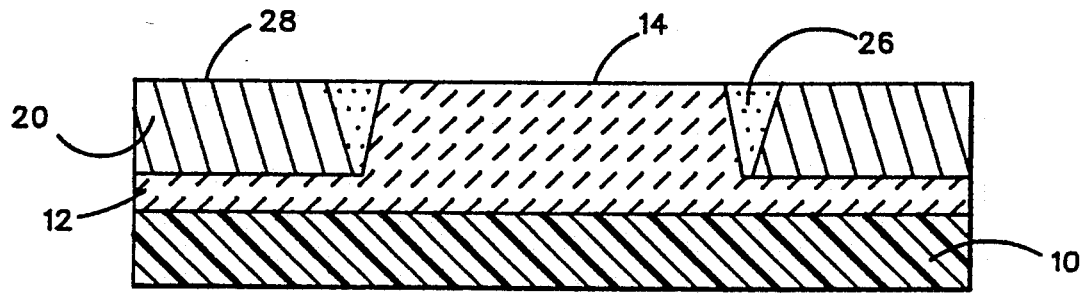
FIG. 1e illustrates etching to expose desired surfaces.

As shown in FIG. 1e, once the polyimide 26 is spun on, the material is etched to remove the polymer down to the top surface of the mesas 14. An exemplary method of removing the desired portions of the polyimide 26 is a low-pressure reactive ion etching process, using oxygen plasma, at a vertical inclination of about 0° or substantially perpendicular to the layer of polyimide 26 or the wafer 10. Reactive ion etching is employed because it provides selective etching of the polyimide and does not etch the SiO or mesa materials. The reactive ion etching also results in low re-polymerization in the processing chamber. New material can then be deposited on the surface 28 which is now highly planar.

It has been discovered that using the method of the present invention, a planar surface can be manufactured which is planar to within about 200 Å (0.02 microns) or less. This represents an advancement over the art which did not previously achieve this high degree of planarity. Such high degree of isoplanar refinement now allows greatly improved yield and device integrity with improved interlevel density.

An alternate embodiment is illustrated in FIG. 2 where the method of the present invention is applied to the manufacture of multi-layered metal interconnection structures. As seen in FIGS. 2a and 2b a layer of metallic interconnect material 32 such as, but not limited to, aluminum or aluminum-copper and aluminum-silicon-copper alloys is deposited on a substrate 30 and covered with a photoresist 36. The photoresist 36 is then patterned and the material 32 etched, as before, to produce desired interconnection features 34, sometimes referred to as wires.

Figure 2A:
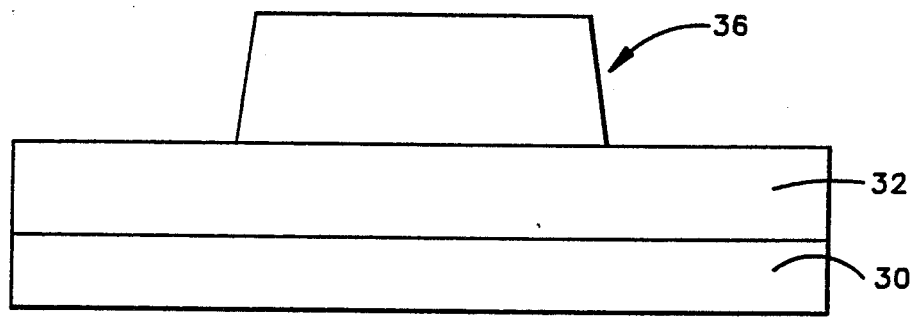
FIG. 2a and 2b illustrate the deposition and formation of a first metallic interconnect structure on a substrate.
Figure 2B:
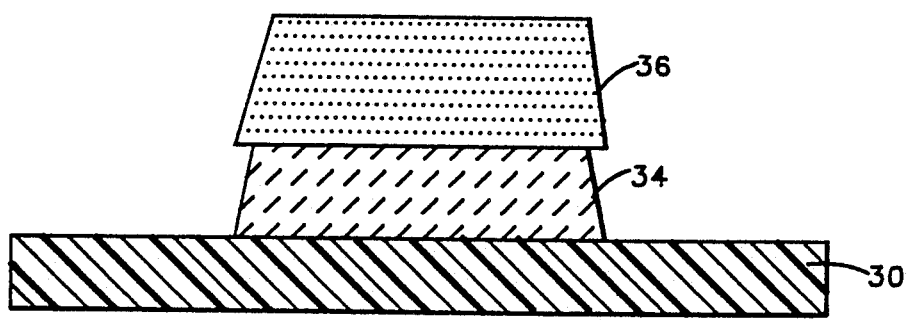
Figure 2C:
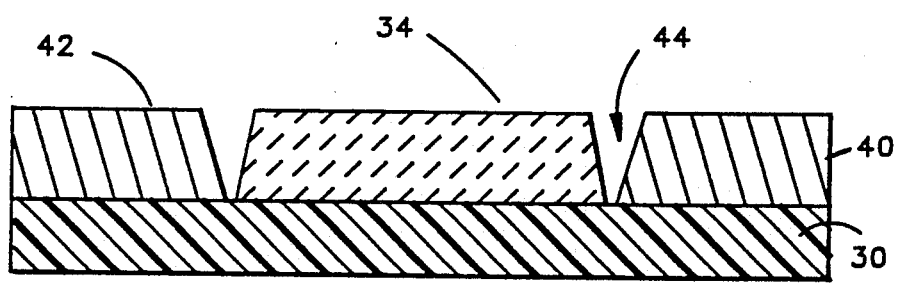
FIG. 2c illustrates backfilling between intermetallic features with dielectric material.
Figure 2D:
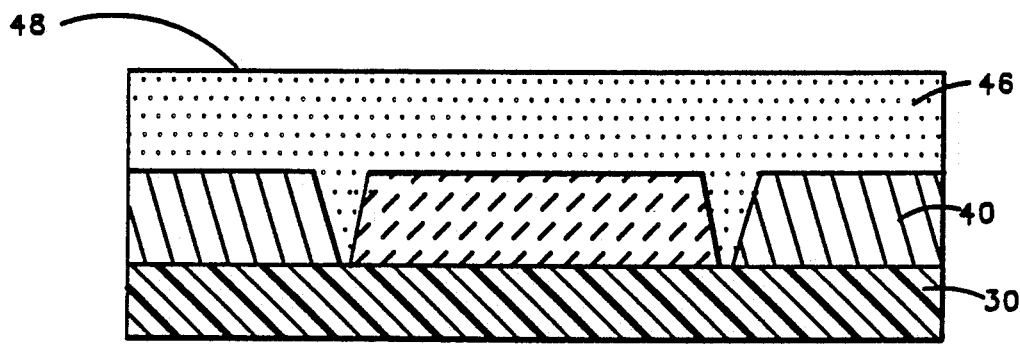
FIG. 2d illustrates the formation of a planarized polymer layer on the first metal.
Figure 2E:
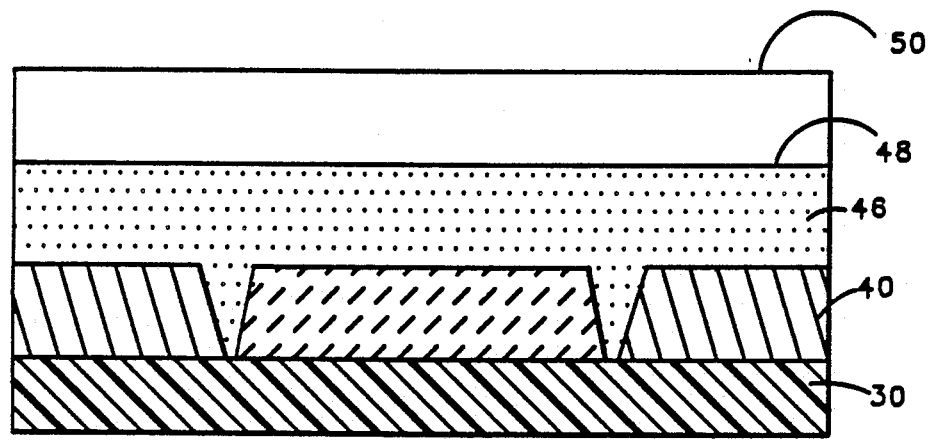
FIG. 2e illustrates the formation of secondary metallic layers on top of the polymer.

As seen in FIGS. 2c and 2d the volumes or depressions between interconnect wires or raised contact areas 36 are then backfilled with a dielectric material 40, such as SiO, to the height of the interconnect features 34. The etching process for such features being well understood and controllable with high precision allows, as before, an accurate determination of the height of the features 34. Therefore, the amount of SiO in the layer 40 and processing parameters required for controlling its deposition by particular methods, such as evaporation, are also known and understood.

The deposition of dielectric material produces a surface 42 having the naturally occurring gaps 44 due to shadow and masking effects of the photoresist 36. To compensate for the gaps 44, a layer of polyimide 46 is deposited on top of the surface 42 by spin coating. The polyimide layer 46 fills in the gaps 44 and produces a new highly planar surface 48. At this point, rather than etch the polyimide layer 46, it is left as a highly planar surface and subsequent layers 50 of aluminum, or other interconnect materials, are deposited thereon. This series of steps is repeated until a desired number of metallic interconnect layers are constructed. Vias or passages are then etched between the layers as desired using known techniques.

A preferred application of the method of the present invention to the manufacture of Heterojunction Bipolar Transistor (HBT) devices or structures is illustrated in more detail in FIG. 3. In useful applications, semiconductor features or mesas for HBTs comprise a series of doped layers using materials such as GaAs, n− AlGaAs, or p+ GaAs along with a cap layer. These materials are generally grown in layers on an n− body and an $n^{30}$ base or substrate. In addition, vertical isolation regions or channels are employed adjacent to mesa sites.

As shown in FIG. 3, a heterojunction bipolar semiconductor wafer 58 with a substrate 60 is used. A heterojunction is formed on the wafer 58 between differing semiconductor compounds residing in the material layers 66 and 68. The compounds typically employed for the material layers 68 and 66 comprise materials such as n− $Al_xGa_{1-x}As$ and p+ GaAs, respectively, which form a p-n junction due to the n-type conductivity of the $Al_xGa_{1-x}As$ semiconductor material and the p-type conductivity of the GaAs material. A second junction is formed by the material layers 66 and 64 which comprise GaAs material in the form of p+ GaAs and n GaAs respectively.

Although the succeeding discussion relates to a preferred single heterojunction embodiment, it will be readily apparent that other configurations or structures can benefit from application of the inventive method. Other exemplary configurations include homojunction transistors or semiconductor devices and multiple junction (material layers) devices.

The wafer structure 58 generally employs a series of material layers formed on the substrate 60 using techniques known in the art such as Molecular Beam Epitaxy (MBE) or Metal Organic Chemical Vapor Deposition (MOCVD). The various semiconductor layers are also capped with a cap layer 70 to facilitate the formation of ohmic contacts as required, which typically comprise a thin layer of n+-type material such as GaAs or InAs.

The location of each transistor on the surface of the wafer 58 or substrate 60 is determined by a photoresist mask or pattern (not shown) formed on the cap layer 70. The photoresist 76 is deposited as a thick layer of material which is exposed through a mask and developed using known techniques. Portions of the photoresist 76 are removed where desired, according to patterning, and the uppermost portions of the layers 66, 68, and 70 etched down to the n-drift regions of layer 64. This leaves trenches or depressions between raised mesas or pedestals 74 which are used in manufacturing the heterojunction bipolar transistors.

The same photoresist can then be used as a mask for isolation implanting. Isolation channels or regions 72 are formed around desired transistor locations through the use of known implantation techniques. Since the uppermost layers are removed, boron bombardment has proven a useful technique.

Figure 3A:
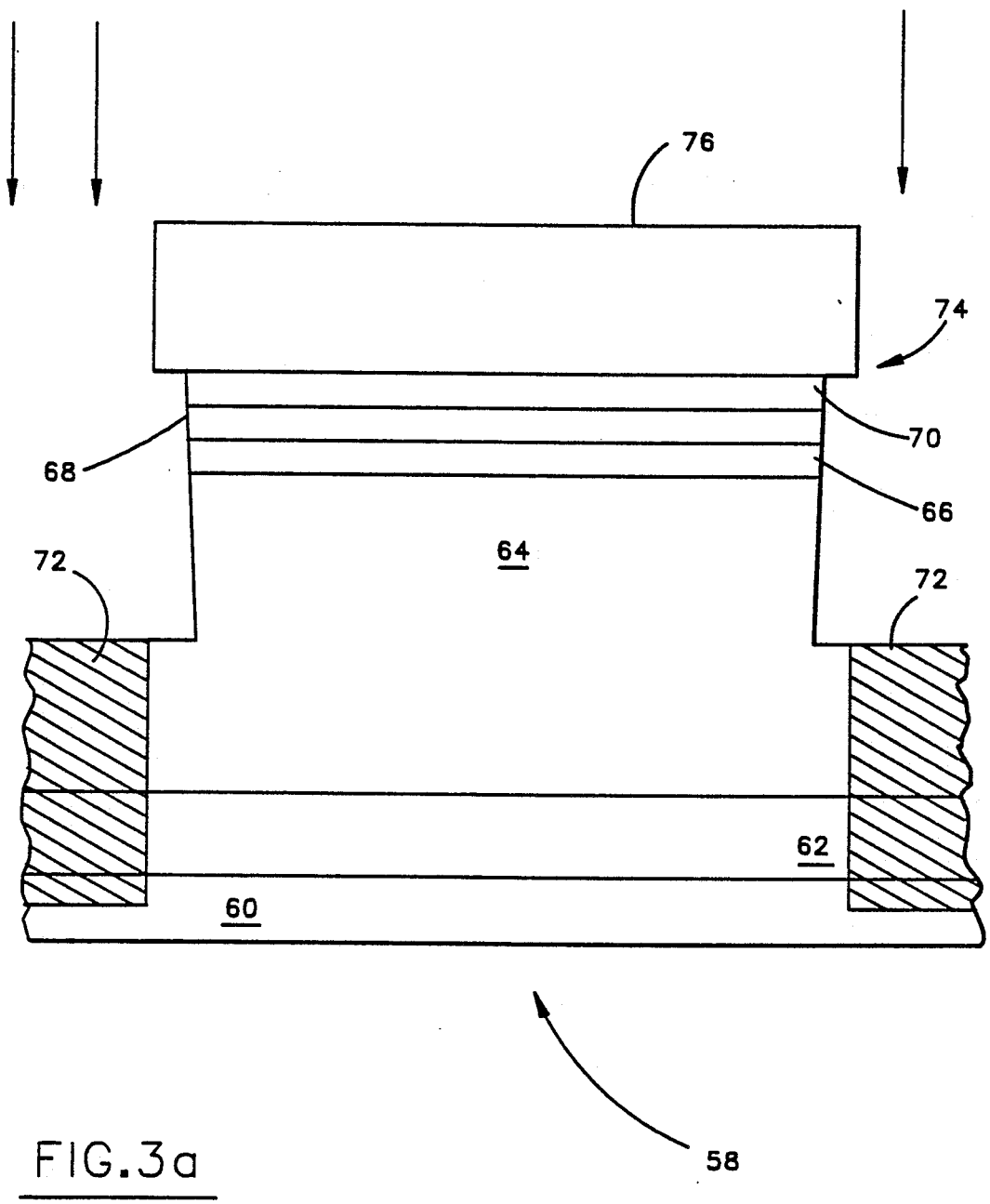
FIG. 3a illustrates formation of multi-layered mesas and related features on a substrate.
Figure 3B:
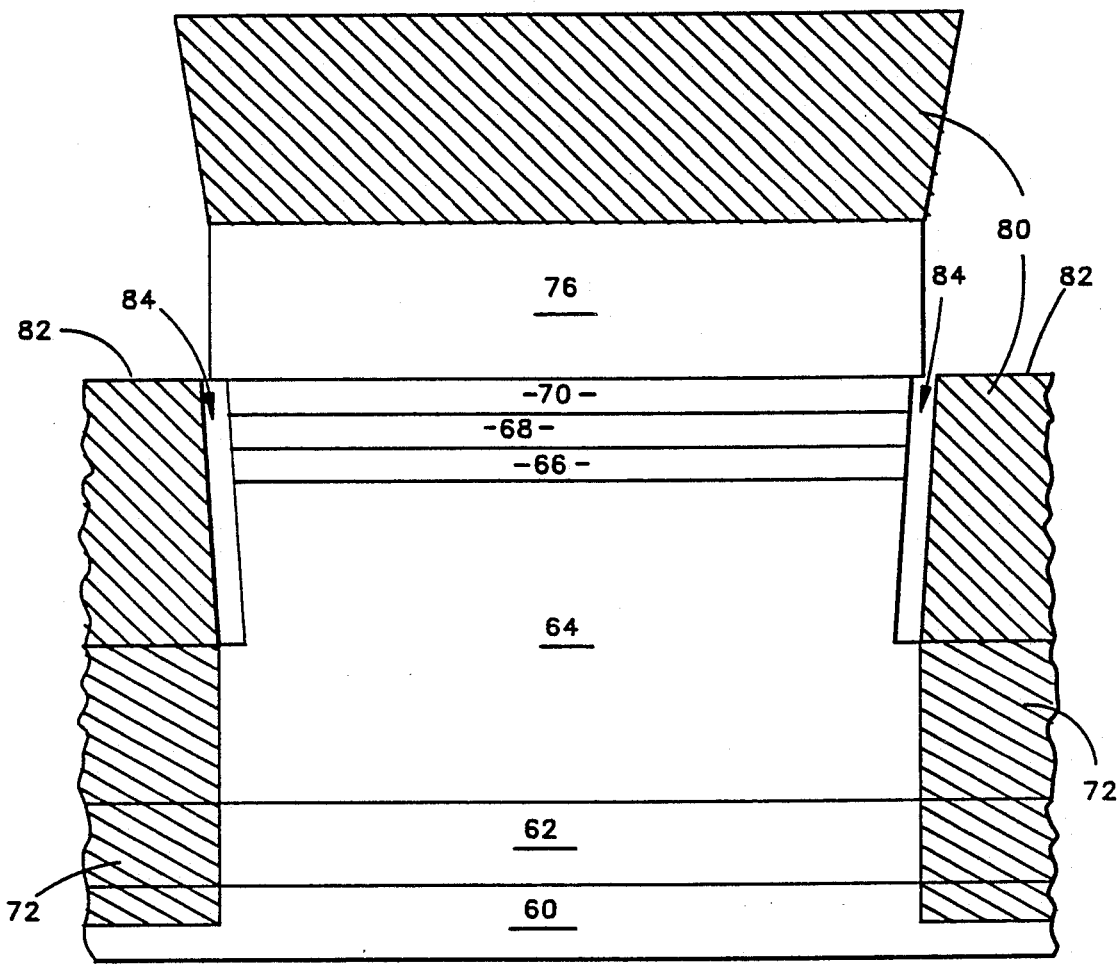
FIG. 3b illustrates backfilling volume adjacent said features.

As previously described and as shown in FIG. 3b, dielectric material in the preferred form of a layer 80 of SiO is used to backfill adjacent to the mesas 74. The SiO is deposited between the mesas to provide a substantially planar surface 82 congruent with the tops of the mesas 74. The excess photoresist 76 is then removed from the tops of the mesas 74 so as to remove the dielectric material 80 deposited thereon. This lift-off step makes the dielectric self-aligning with the mesas 74.

Figure 3C:
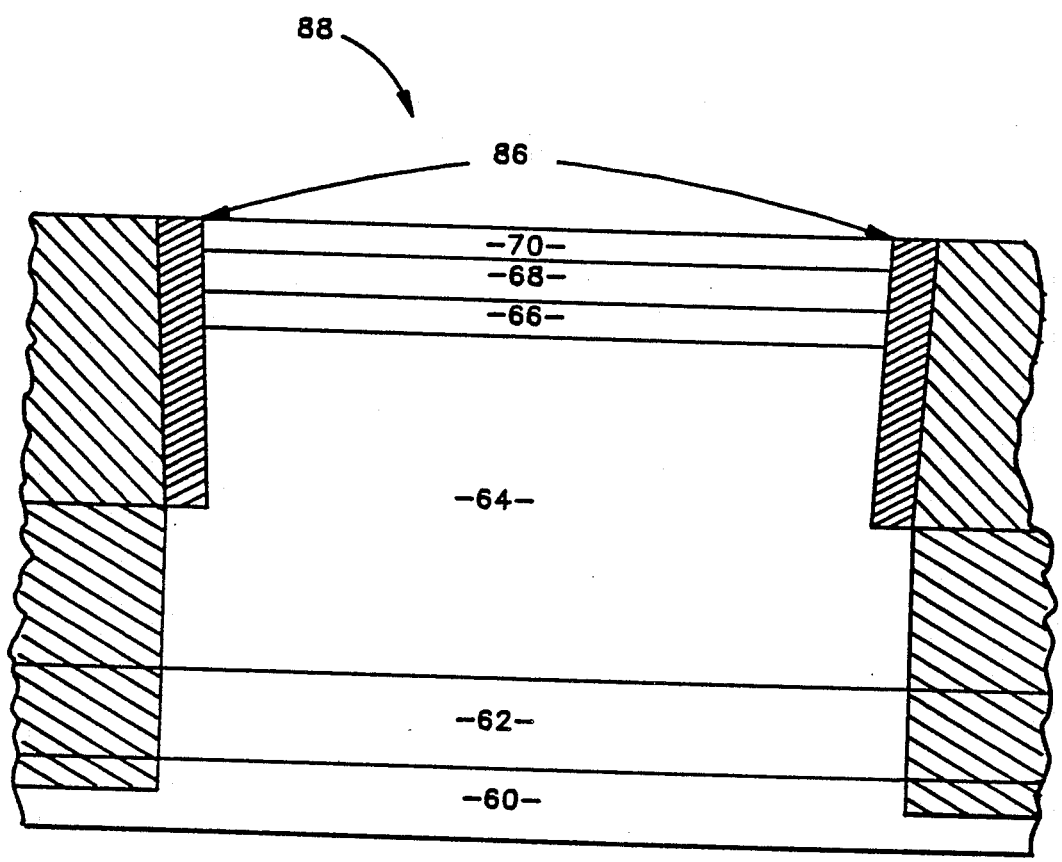
FIG. 3c illustrates deposition and etching of a self-aligning polymer.

The application of dielectric material 80 results in small gaps 84 between the dielectric 80 and sidewalls of the mesas 74. As illustrated in FIG. 3c, a thin layer of polyimide 86 is then deposited on the dielectric 80 to fill the gaps 84 and planarize the surface 82. The polyimide layer 86 is subsequently etched, preferably using low-pressure reactive ion etching, with oxygen plasma, down to the top of the mesa 74 cover layer 70. This provides a highly planar surface 88 which is useful in subsequent deposition, etching, and ion bombardment steps for forming the final bipolar transistor devices and leaves the top of the mesas 74 open for this subsequent processing. This method also minimizes re-polymerization and surface contamination of enclosures being used.

Figure 3D:
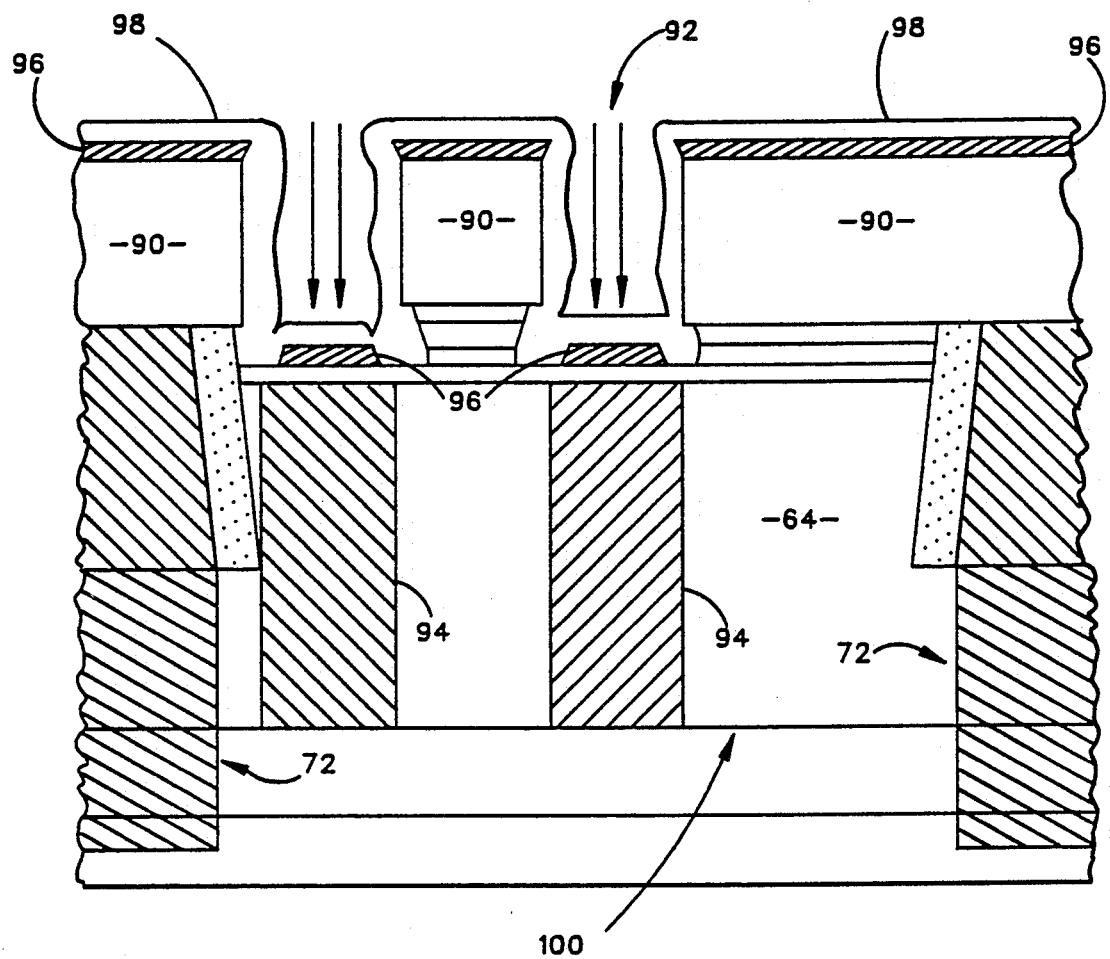
FIG. 3d illustrates formation of base contacts for the HBT using ion implantation and other processes.
Figure 3E:
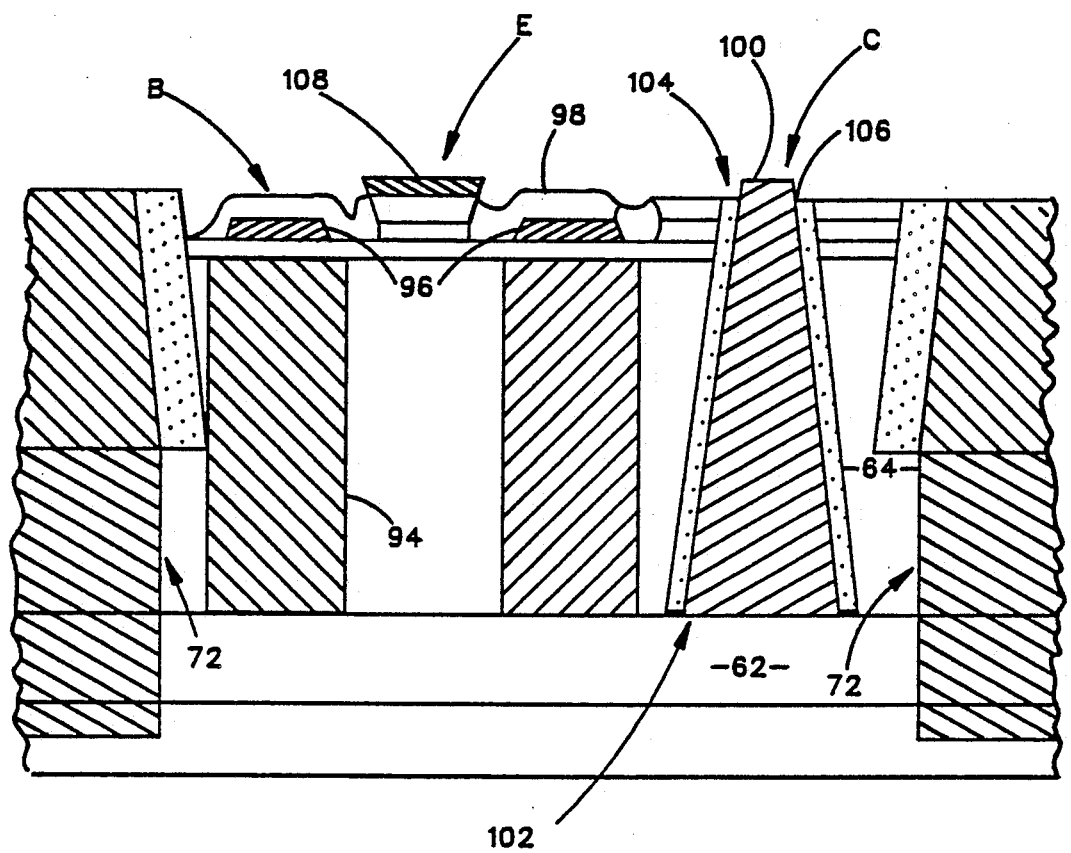
FIG. 3e illustrates formation of emitter and collector contacts for an HBT.

As illustrated in FIG. 3d, after the polyimide 86 is removed down to the top of the mesas 74, additional photoresist material 90 is deposited on the planar surface 88. The photoresist 90 is patterned using a mask (not shown) which positions or determines emitter locations for each heterojunction bipolar transistor device.

The patterned photoresist 90 is then used as a mask for etching vias 92 through the layers 68 and 70 to the base layer 66 which provides or exposes active base areas. The vias 92 can be used in masking proton implantation, to create implanted regions 94, for base-collector capacitance reduction and then for the deposition of a base contact metal. Typically a base metal or alloy such as Au/Zn/Au is deposited through the vias 92 by evaporation and produces the base contacts 96.

A protective barrier layer 98 comprising a dielectric material such as $Si_3N_4$ is applied to the wafer structure 58 and covers the base metal contacts 96. The remaining photoresist 90 is then moved in a "dual" lift-off process that removes excess dielectric and metallic material. The lift-off process patterns the base metal and the dielectric, leaving metal buttons comprising the base contacts 96 overlaid with the dielectric cover of $Si_3N_4$. The protective dielectric 98 protects the base metal contacts 96 as well as the emitter sidewalls. The separation distance between the base metal and the active emitter is determined by the degree of undercut during etch down of the layers 68 and 70 to the base layer 66. It will be readily apparent that this separation distance is controllable to be less than 0.2 microns to minimize base resistance.

Emitter metal 108 is deposited after the lift-off of the photoresist 90. No critical mask alignment is required for the emitter metal deposition since the base metal area is covered with the dielectric and the emitter metal can overlap the base region or area without direct metal contact.

To establish a collector contact 100, a via or passage 102 is etched through the material layers 64, 66, 68, and 70 to the subcollector layer 62. This etching process, when properly controlled, results in the passage or via 102 having angled or slanted sidewalls. An n-type collector contact metal such as AuGe/Ni/Au is then evaporated to a thickness equivalent to the etch depth for the via 102 plus an appropriate contact extension thickness. The contact metal deposited in the via 102 also has angular sidewalls that form a generally conical contact body. However, masking effects leave a gap 104 between the sides of the contact metal and the sides of the via 102. Therefore, the contact 100 is stabilized, and the upper surface of the collector area planarized, by deposition of polyimide 106. The polyimide 106 is typically applied using spin-coating and subsequently reactive ion etched to provide the desired planar surface.

Using the method of the present invention, the highest temperature in device fabrication corresponds to that of ohmic contact alloying (360°–400° C.). This means that the process of planarization does not alter the device structure or processing in any significant manner.

The foregoing description of preferred embodiments has been presented for purposes of illustration and description. It is not intended to be exhaustive nor to limit the invention to the precise forms disclosed, and many modifications and variations are possible in light of the above teaching. It will be clear, for example, that materials other than SiO or $SiO_2$ can be used for the dielectric layers 20, 40, or 80 or that alternate masks, etching techniques, or conditions can be employed without departing from the teachings of the invention. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What we claim as our invention is:

1. A method of manufacturing a heterojunction bipolar transistor with substantially isoplanar surfaces, comprising the steps of:
    providing a semiconductor wafer having a plurality of layers of semiconductor material, said layers forming at least one p-n junction comprising a heterojunction;
    forming a pattern of photoresist on said wafer, said photoresist pattern having an opening;
    etching predetermined layers of said semiconductor material through said photoresist opening;
    depositing dielectric material atop said photoresist and said etched layers of semiconductor material;
    removing said photoresist and dielectric material deposited thereon; and
    disposing a thin layer of polymer material atop said wafer and into gaps between said etched layers of semiconductor material and said dielectric material.

2. The method of claim 1 wherein said step of disposing said thin layer of polymer comprises the step of spin coating polyimide in a liquid state atop said wafer.

3. The method of claim 2 further comprising the steps of:
    etching said thin layer of polyimide until said polyimide is removed from atop said wafer;
    forming a second photoresist pattern on said wafer, said second photoresist pattern having a second opening;
    etching second predetermined layers of said semiconductor material through said second photoresist opening;
    depositing contact metal atop said second etched semiconductor material;
    depositing a second layer of dielectric material atop said contact metal, said etched semiconductor, and said second photoresist;
    removing said second photoresist and said dielectric material deposited thereon;
    disposing a second thin layer of polyimide atop said wafer and into gaps between said second etched layers of semiconductor material and said second layer of dielectric material.

4. The method of claim 1 further comprising the step of etching said thin layer of polymer until said polymer is removed from atop said wafer.

5. The method of claim 4 wherein said step of etching comprises the step of reactive ion etching said polymer.

6. The method of claim 1 wherein said step of depositing dielectric material comprises the step of depositing SiO onto said etched semiconductor material up to said layer of photoresist material.

7. A method of manufacturing a heterojunction bipolar transistor, comprising the steps of:
    providing a heterojunction bipolar semiconductor wafer having a first layer of a first conductivity type, a second layer of a semiconductor of second conductivity type on the first layer, a third layer of a semiconductor of an opposite conductivity type to the second layer being positioned on the second layer forming a p-n junction, and a fourth layer of a semiconductor of the second conductivity type on the third layer forming a second p-n junction, at least one of the p-n junctions being a heterojunction;
    forming a photoresist pattern on the wafer with an opening which defines a transistor location;
    etching the third and fourth layers through an opening in the photoresist pattern down to the second layer and a portion of the second layer toward the first layer;
    depositing a dielectric material on the second layer through the opening;
    removing remaining photoresist material and dielectric material deposited thereon from the wafer;
    depositing a thin layer of polymer on said wafer and into gaps between said dielectric and said second, third, and fourth layers;
    forming a photoresist pattern on the wafer with a second opening which defines a base location for the heterojunction bipolar transistor;
    etching the fourth layer through the second opening to the third layer;
    depositing base contact metal on the third layer through the opening;
    depositing a second dielectric on the base contact metal and on the sidewalls of the second opening;
    lifting off the photoresist with overlying second dielectric and metal while maintaining dielectric on the sidewalls;
    defining a location for emitter contact metal on the fourth layer;
    depositing emitter contact metal on the emitter contact location;
    providing a passage through said fourth, third and second layers to the first layer; and
    depositing collector contact metal on the first layer through the passage.

8. The method of claim 7 further comprising the step of depositing polymer through said passage around said collector contact metal.

9. The method of claim 7 wherein said polymer comprises polyimide.

10. The method of claim 7 further comprising the step of:
    providing a plurality of semiconductor layers on sad fourth layer with some of said layers having opposing conductivity types so as to form additional p-n junctions thereon; and
    said steps of etching and depositing further comprise etching portions of said plurality of layers and depositing dielectric material thereon.

11. The method of claim 7 wherein at least one of said p-n junctions is a homojunction.

* * * * *